United States Patent [19]

Masuoka et al.

[11] Patent Number: 6,052,677
[45] Date of Patent: Apr. 18, 2000

[54] NEXT ALTERNATIVE GENERATING APPARATUS USING SIMULATED ANNEALING AND METHOD THEREOF

[75] Inventors: Ryusuke Masuoka; Hironobu Kitajima, both of Kanagawa, Japan

[73] Assignee: Fujitsu Limited, Kawasaki, Japan

[21] Appl. No.: 08/959,296

[22] Filed: Oct. 24, 1997

Related U.S. Application Data

[63] Continuation of application No. 08/567,905, Dec. 6, 1995, abandoned.

[30] Foreign Application Priority Data

Feb. 24, 1995 [JP] Japan .................................. 7-037222

[51] Int. Cl.⁷ ..................................................... G06N 7/08
[52] U.S. Cl. ................................ 706/12; 706/14; 706/920
[58] Field of Search ........................... 395/10, 23, 500.3, 395/500.06–500.07, 500.09–500.11, 500.39, 500.35; 706/10, 25, 12, 14, 19, 45, 920; 382/162, 167, 254, 274

[56] References Cited

U.S. PATENT DOCUMENTS

| 5,134,685 | 7/1992 | Rosenbluth | 395/21 |
|---|---|---|---|
| 5,241,465 | 8/1993 | Oba | 364/401 |
| 5,274,742 | 12/1993 | Morita | 395/22 |
| 5,303,328 | 4/1994 | Masui | 395/23 |
| 5,475,608 | 12/1995 | Masuoka | 364/491 |
| 5,754,444 | 5/1998 | Koford | 395/500.1 |
| 5,813,798 | 9/1998 | Whiffen | 405/52 |

OTHER PUBLICATIONS

H. Igarashi, "An estimation of parameters in an energy function used in a simulated annealing method," 1992 International Joint Conference on Neural Networks, vol. 4, pp. 480–485, Jun. 1992.

Chong Su Yu et al. "Parallel mean field annealing neural network for solving traveling salesman problem," 1992 International Joint Conference on Neural Networks, vol. 4, pp. 532–536, Jun. 1992.

A. Rangarajan et al, "A continuation method for emission tomography," Conference Record of the 1992 Nuclear Science Symposium and Medical Imaging Conference, vol. 2, pp. 1204–1206, Oct. 1992.

Qian, "Computer networking representations for parallel distributed computing algorithms," IEEE Proceedings of Intl Conf on Neural Networks vol. 2 pp. 1577–81, Oct. 1993.

Chen, "Electronic structure and morphology of alkali–metal clusters," J. Phys. B: At. Mol. Opt. Phys. 23, pp. 885–903, Dec. 1990.

(List continued on next page.)

*Primary Examiner*—Eric W. Stamber
*Assistant Examiner*—Jason W. Rhodes
*Attorney, Agent, or Firm*—Armstrong, Westerman, Hattori, McLeland & Naughton

[57] ABSTRACT

A multi-dimensional Gauss distribution generating portion obtains one vector from a multi-dimensional Gauss probability distribution and outputs it as an initial momentum. An approximated energy function differential generating portion generates a gradient of an approximated energy function. A Hamilton equation integral portion integrates a Hamilton equation using a gradient of an approximated energy function for a predetermined integral period with initial conditions of an initial state and an initial momentum. The result of the integration as the state of the next alternative is output from a next alternative generating apparatus. The state is used with a high probability corresponding to the difference of approximated energy calculated by an approximated energy difference calculating portion and the difference between a value of an original energy in the present state and that in the next state.

8 Claims, 11 Drawing Sheets

OTHER PUBLICATIONS

Poteau, "Distance dependent Huckel type model for the study of sodium clusters," Physical review B vol. 45 No. 4, Jan. 1992.

Lu, "first principles simulated annealing study of phase transitions and short range order in transition metal and semiconductor alloys," Physical review B vol. 50 No. 10, Sep. 1994.

De Groot, "Optimizing complex problems by nature's algorithms: simulated annealing and evolution strategy–a comparative study," IEEE conf of parallel problem solving from nature, Oct. 1990.

Pensini, "Flowshop and TSP," , Dec. 1991.

Beckerman, "Segmentation and cooperative fusion of laser radar image data," SPIE conf on sensor fusion and aerospace applications II vol. 2233, Dec. 1994.

Hynderickx, "Simulated anneal method for the determination of spin hamiltonian parameters from esr data," Journal of magnetic resonance vol. 70, Dec. 1986.

Goldstein, "Optimal protein folding codes from spin glass theory," Proc Natl Acad Sci USA vol. 89, Jun. 1992.

Puma, "Computer analysis of electron paramagnetic resonance data using the monte carlo method," J Phys C: solid state phys. 21, Dec. 1988.

Duane, "Hybrid Monte Carlo," Physics Letters B vol. 195 No. 2, Sep. 1987.

Tomanek, "Growth regimes of carbon clusters," Physical review letters vol. 67, Oct. 1991.

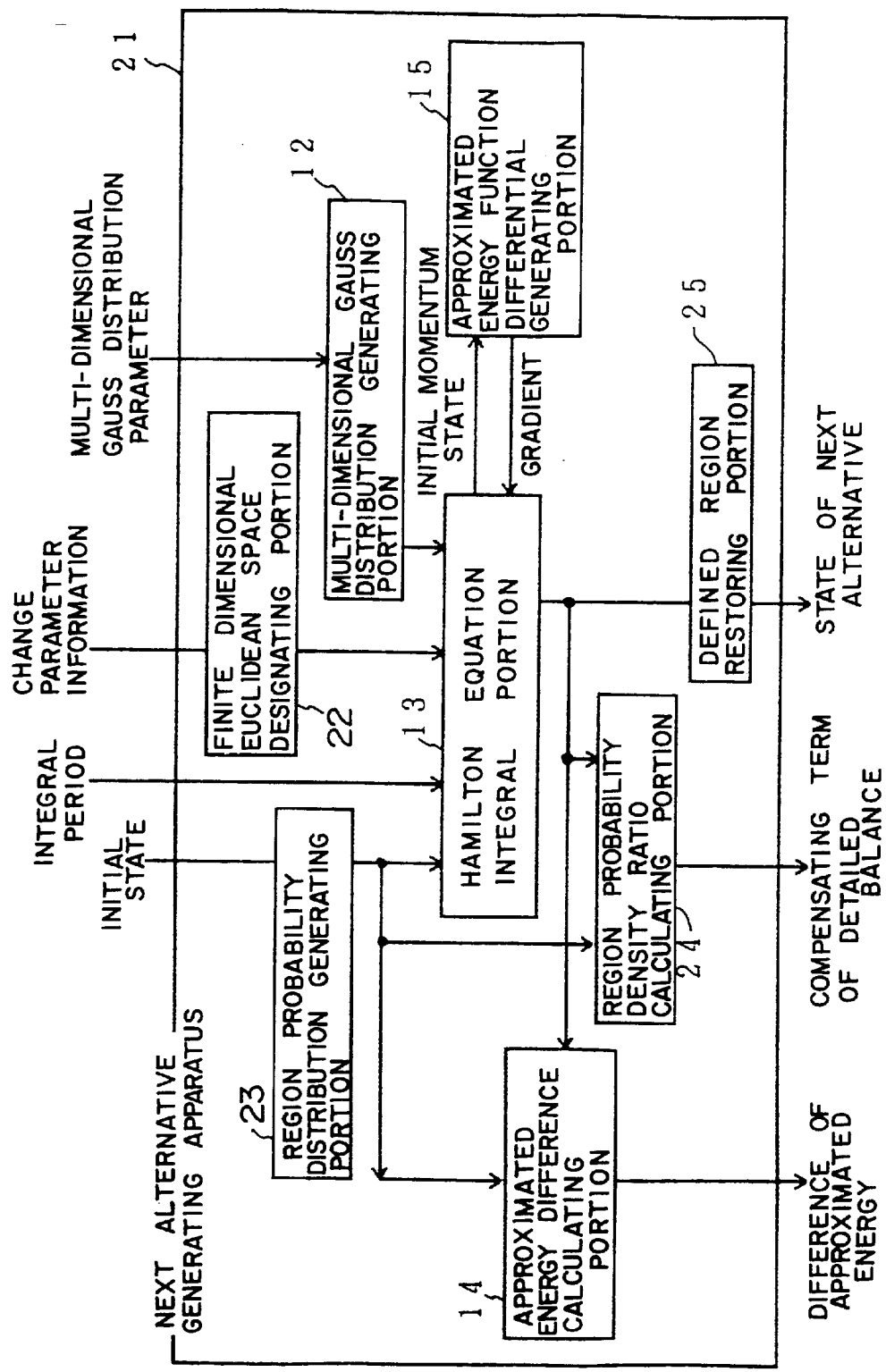
F I G. 4

NEXT ALTERNATIVE GENERATING APPARATUS USING SIMULATED ANNEALING AND METHOD THEREOF

This application is a continuation of application Ser. No. 08/567,905 filed Dec. 6, 1995, now abandoned.

BACKGROUND OF THE INVENTION

1. Field of the Invention

The present invention relates to a processing apparatus for solving an optimizing problem using simulated annealing (hereinafter, referred to as SA) and a method thereof.

2. Description of the Related Art

In recent years, in order to solve problems in various fields, it has become necessary to solve relatively large optimizing problems. The SA is a general-purpose solving method for solving such optimizing problems. The SA has been successfully used for optimizing problems such as cell placing problems in VLSI (very large scale integration) design and scheduling in production process.

In the annealing method, a substance is heated to a high temperature and then gradually cooled so that the energy thereof physically becomes the minimum state (ground state). In a system to be evaluated, evaluating energy is defined. An annealing process of the system is simulated corresponding to metropolis procedure so as to optimize the state of the system. This technique is referred to as SA.

Next, the algorithm of conventional SA will be described. First, assume a system that is composed of many objects that have various states. The sum of states of all the objects is the state of the system. As a real function of the state of the system, energy is defined. When SA is applied for a problem of a combination, energy is defined corresponding to an evaluation value of the combination. As the energy is low, the evaluation is high.

Next, objects are selected in a proper order. For each object, the metropolis procedure is applied. States of alternatives with probabilities are designated to each object. A system energy $E_f$ in the state of an alternative designated to each object and a system energy $E_n$ in the present state are calculated. On the other hand, random numbers in the range from 0 to 1 are uniformly generated. The generated random numbers are denoted by r. A temperature parameter is denoted by T. When $\exp[-(E_f-E_n)/T] \geq r$, each object is designated to the state of the alternative. On the other hand, when $\exp[-(E_f-E_n)/T] < r$, each object is kept in the present state.

When this operation is continued with T (constant), the system converges to a Gibbs distribution due to the temperature T and the system energy. When T is gradually decreased and approaches 0, the system converges to a state of which the minimum value or semi-minimum value of energy is given. The latter is referred to as SA due to an analogy of a physical phenomenon. In particular, a temperature change schedule is referred to as an annealing schedule. Logically, it has been proved that when the temperature T is very gradually decreased, the system converges to a state of which the minimum value of the energy is given. However, practically, so as to reduce the process time, the temperature is relatively quickly decreased.

The SA has the following advantages. As a first advantage, it is logically assured that the system converges to an optimum solution. In reality, the system converges to an optimum solution or a semi-optimum solution. As a second advantage, since the SA can be generally used, it can be easily applied for various problems. As a third advantage, functions that represent system energy or restricting condition have almost no restrictions and they may be discontinuous.

However, as described above, since the algorithm of the SA is basically a sequence of simple operations that determine whether or not to accept the state of the next alternative, it may take a very long time. In addition, the acceptance of the state of the alternative depends on the difference of energy in the present state and the state of the alternative. Thus, the state is not always accepted. When the state of the alternative is not accepted, since the system remains in the present state, the convergence of the system is further delayed.

In other words, when the SA is used, a good solution can be finally obtained. However, it takes a very long time to obtain a solution. Thus, it is necessary to perform the system at a high speed.

SUMMARY OF THE INVENTION

An object of the present invention is to modify the algorithm of the SA so as to provide a processing apparatus for solving an optimizing problem at high speed and a method thereof.

As an aspect of the present invention, when determining whether or not to transit the present state to the next state, an alternative of the next state is selected so that the probability for accepting the alternative of the next state becomes high. In other words, the probability for selecting the alternative of the next state is designated so that the alternative is accepted as the next state with a high probability. Thus, the simulated annealing process can be performed at high speed, thereby contributing to solving various optimizing problems.

These and other objects, features and advantages of the present invention will become more apparent in light of the following detailed description of best mode embodiments thereof, as illustrated in the accompanying drawings.

BRIEF DESCRIPTION OF DRAWINGS

FIG. 4 is a block diagram showing a second construction of a next alternative generating apparatus according to an embodiment of the present invention;

DESCRIPTION OF THE PREFERRED EMBODIMENTS

The present invention is a next alternative generating apparatus and a method thereof for determining a next state in an SA process so as to solve an optimizing problem.

Figure 1:
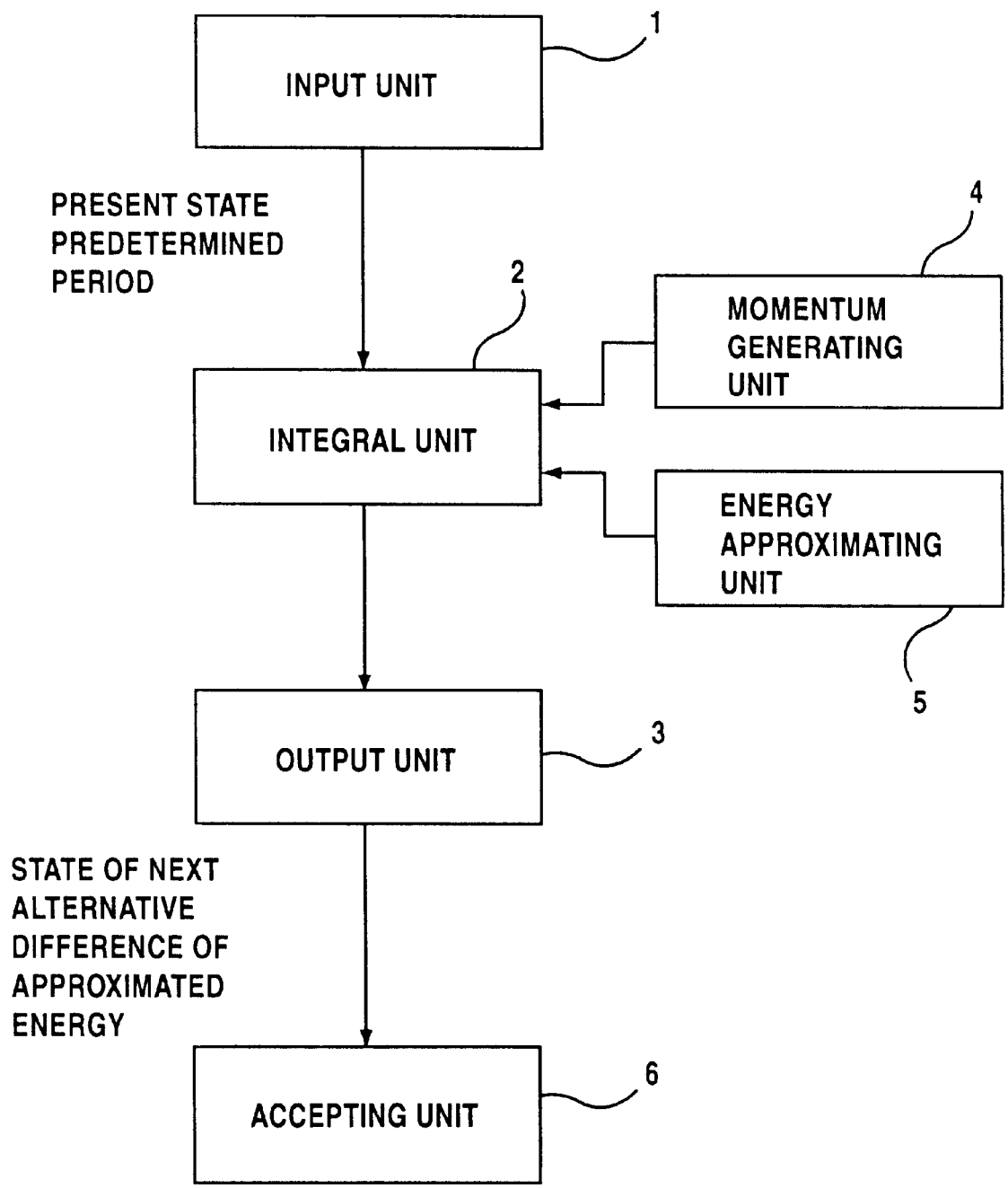
FIG. 1 is a theoretical block diagram according to the present invention.

FIG. 1 is a theoretical block diagram showing a next alternative generating apparatus according to the present invention. The next alternative generating apparatus, shown in FIG. 1, comprises an input unit 1, an integral unit 2, an output unit 3, a momentum generating unit 4, an energy approximating unit 5, and an accepting unit 6.

The input unit 1 inputs a present state and a predetermined period. The momentum generating unit 4 generates a momentum. The energy approximating unit 5 generates an approximated value of a value with respect to approximated energy. The integral unit 2 integrates a Hamilton equation using the approximated value generated by the energy approximating unit 5 for the predetermined period with initial conditions of the present state received from the input unit 1 and the momentum generated by the momentum generating unit 4. The output unit 3 outputs the state of which the Hamilton equation is integrated by the integral unit 2 as the state of the next alternative.

The output unit 3 outputs the difference between the value of the approximated energy in the present state and the value of the approximated energy in the next alternative state to the accepting unit 6.

The accepting unit 6 determines whether or not to accept the state of the next alternative received from the output unit 3 based on both the difference of the approximated energy and a difference between the value of an original energy in the present state and the value of the original energy in the next alternative state so that detailed balance is satisfied.

Figure 5:
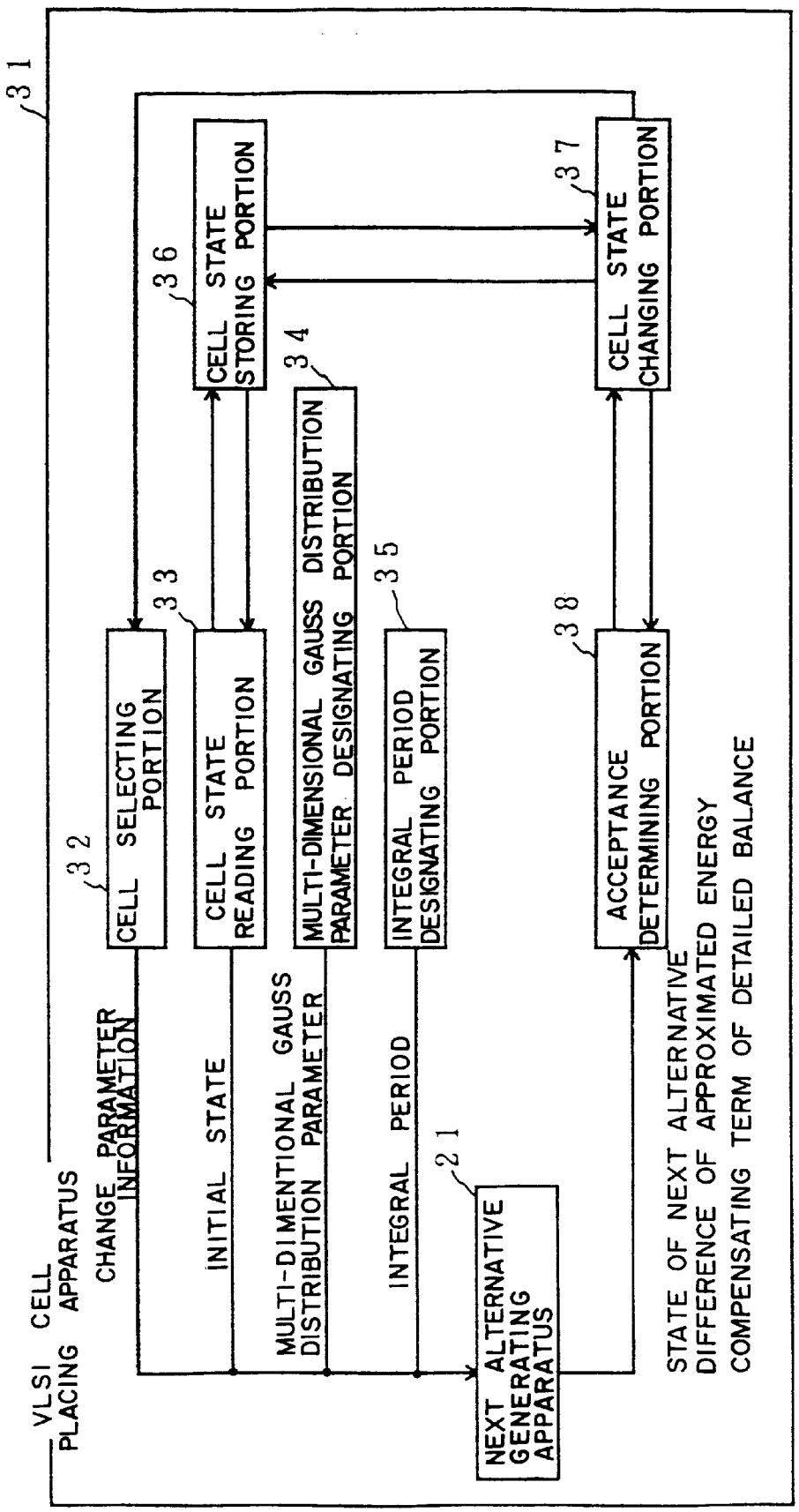
FIG. 5 is a block diagram showing a construction of a VLSI cell placing apparatus.

The input unit 1, shown in FIG. 1, corresponds to a finite dimensional Euclidean space designating portion 22 and a region probability distribution generating portion 23, shown in FIG. 4, a cell selecting portion 32, a cell state reading portion 33, an integral period designating portion 35, shown in FIG. 5, and so forth. The integral unit 2 corresponds to a Hamilton equation integral portion 13, shown in FIGS. 2 and 4. The output unit 3 corresponds to a Hamilton equation integral portion 13, an approximated energy difference calculating portion 14, a region probability density ratio calculating portion 24, a defined region restoring portion 25, and so forth. The momentum generating unit 4 corresponds to a multi-dimensional Gauss distribution generating portion 12, shown in FIGS. 2 and 4, and a multi-dimensional Gaussian distribution parameter designating portion 34, shown in FIG. 5. The energy approximating unit 5 corresponds to an approximated energy function differential generating portion 15, shown in FIGS. 2 and 4. The accepting unit 6 corresponds to an acceptance determining portion 38, shown in FIG. 5.

Generally, a Hamilton equation describes coordinates that represent a state and a time change of a momentum that is conjugate to the coordinates with potential energy. Thus, when a solution of the Hamilton equation is obtained, the coordinates, the initial value of the momentum and a function form of the potential energy, or a function form of the differential thereof, are required.

In the next alternative generating apparatus, shown in FIG. 1, the input unit 1 inputs a present state that is equivalent to the initial coordinates to the integral unit 2. The momentum generating unit 4 generates an initial momentum and outputs it to the integral unit 2. The integral unit 2 uses the initial momentum as an initial value.

The energy approximating unit 5 generates an amount of approximated energy that is equivalent to the potential energy (for example, an approximated value of the gradient of the approximated energy) and inputs the amount to the integral unit 2. The gradient of the approximated energy corresponds to a gradient of an approximated energy function of the embodiment. The integral unit 2 can numerically integrate the Hamilton equation using the above-described approximated value on an integral path instead of the function form of the potential energy. After a predetermined period designated by the input unit 1 elapses, the state obtained at the point is output.

According to this method, a precise function form of the potential energy is not required. With a proper approximated energy function, the Hamilton equation can be integrated. In particular, with a simply approximated energy function, calculations are simplified, thereby increasing the speed of the integral unit 2.

The output unit 3 outputs the state obtained by the integral (namely, the state equivalent to the end point of the integral path as the state of the next alternative) to the accepting unit 6. The accepting unit 6 determines whether or not to accept the state of the next alternative received from the output unit 3 so that the detailed balance is satisfied.

Since the integral unit 2 that selects the state of the next alternative and the accepting unit 6 that determines whether or not to accept the alternative are independently provided, the probability of selecting the next alternative and the probability of accepting it can be individually adjusted in consideration of the detailed balance. In particular, when the accepting unit 6 adjusts the accepting probability corresponding to the difference of approximated energy received from the output unit 3, the accepting probability can be improved with the detailed balance satisfied. When the accepting probability is high, the state of the next alternative is less discarded. Thus, the next state is quickly determined and thereby the processing speed is increased.

Next, embodiments of the present invention will be described in detail.

First, the detailed balance used in the present invention will be described. The necessary condition of which a Markoff process converges to a single probability distribution $\{P(x)\}$ is a detailed balance that is given by the following equation:

$$P(x)P(x \to y) = P(y)P(y \to x) \quad \forall x, y \quad (1)$$

where $P(x)$ is the probability of which the state x takes place; and $P(x \to y)$ is a transition probability of which the state x transits to the state y. The physical meaning of the equation (1) is in that in a predicted steady state the flow that transits from the state x to the state y is balanced to the flow that transits from the state y to the state x.

In a technique such as the SA, to satisfy the equation (1), the transition probability $P(x \to y)$ is divided into a selective probability $P_C(x \to y)$ and an accepting probability $P_A(x \to y)$ as follows:

$$P(x \to y) = P_C(x \to y) \cdot P_A(x \to y) \quad (2)$$

Thus, the accepting probability $P_A(x \to y)$ is adjusted.

For example, with a Gibbs distribution represented by energy $E(x)$ in the state x of a probability distribution $P(x)$ and temperature T, the detailed balance of the equation (1) is rewritten as follows by the equation (2):

$$\exp[-\{E(y) - E(x)\}/T] = \frac{P(y)}{P(x)} \quad (3)$$

$$= \frac{P_C(x \to y)}{P_C(y \to x)} \cdot \frac{P_A(x \to y)}{P_A(y \to x)}$$

Next, the method for accomplishing the detailed balance of the present invention will be described. If a simple form of an approximated energy function is given to the original energy E(x), when the Hamilton equation is solved with respect to the approximated energy function, the state y of the next alternative can be selected with a particular selective probability.

First, a simple form of approximated energy, $\overline{E}(x)$, of the energy E(x) is given. The simple form represents a form of which the number of calculations is small. The approximated energy $\overline{E}(x)$ is very close to the original energy E(x), not always accurate thereto. For example, even if the approximated energy $\overline{E}(x)$ is inaccurate to some extent, $\overline{E}(x)$ may be approximated to part of the original energy E(x). Of course, it is preferable that $\overline{E}(x)$ is accurately approximated to E(x). However, when the accuracy is required, the number of calculations increases. Thus, in consideration of the total performance, the approximated energy in a proper level should be used.

Thereafter, the next alternative is selected so that the selective probability satisfies the following equation corresponding to the difference of approximated energy between the state x and the state y:

$$\exp[-\{\overline{E}(y) - \overline{E}(x)\}/T] = \frac{P_C(x \to y)}{P_C(y \to x)} \quad (4)$$

To allow the selective probability of the equation (4) to satisfy the transitive probability, the accepting probability and the detailed balance of the equation (3), the accepting probability should satisfy the following equation:

$$\exp[-(\{E(y) - E(x)\} - \{\overline{E}(y) - \overline{E}(x)\})/T] = \frac{P_A(x \to y)}{P_A(y \to x)} \quad (5)$$

Due to the equation (5), when the difference of the approximated energy $\{\overline{E}(y) - \overline{E}(x)\}$ is close to the difference of the original energy $\{E(y) - E(x)\}$ to some extent or when the former is partially approximated to the latter, the accepting probability can be remarkably improved.

For example, assume that the accepting probability with respect to the transition between the state x and the state y is given by the following equation:

$$P_A(x \to y) = \exp[-(\{E(y)-E(x)\}-\{\overline{E}(y)-\overline{E}(x)\})/T] P_A(y \to x) = 1 \quad (6)$$

Thus, the accepting probability of the equation (6) satisfies the equation (5). At this point, the accepting probability $P_A(y \to x)$ is always 1. When the difference of the approximated energy $\overline{E}$ is close to the difference of the original energy E, the accepting probability $P_A(x \to y)$ also approaches to 1. In such a manner, the accepting probability of the selected next alternative can be kept to 1 or a value close to 1. The accepting probability of the equation (6) is only an example. Thus, another accepting probability that satisfies the equation (5) may be used.

In other words, the fundamental feature of the method according to the present invention can be described as follows. First, energy is approximated or predicted in a simple form. The state of a next alternative is selected corresponding to a selective probability that accomplishes the difference of the approximated energy (predicted energy) with a predetermined probability. The difference of the approximated energy and the difference of the actually measured energy are calculated with the accepting probability.

To actually implement this method, the selective probability should be accomplished with the difference of the approximated energy. As an example of the selecting method, a technique used in the Hybrid Monte Carlo method (PHYSICS LETTER S. B., Volume 195, number 2, p.216–222, Sep. 3, 1987) can be used. In particular, when the approximated energy function is a piecewise linear function, the calculations of the HMC method can be simply performed. The piecewise linear function is a function of which pieces of a function are present in a state space and they are linear functions in respective regions.

In the HMC method, as an initial momentum, one vector is obtained from a multi-dimensional Gaussian distribution. Next, a Hamilton equation, of which an energy function is potential energy, is integrated for a predetermined period with initial conditions of the original state (coordinates) and the initial momentum. The resultant coordinates are selected as the state of the next alternative.

In the present invention, when the Hamilton equation is solved (integrated), an approximated energy function $\overline{E}$ is used instead of the original energy function.

When a state variable (coordinates) with any dimensions is denoted by q and a momentum vector with the same dimensions as the state variable is denoted by p, the Hamiltonian to be stored is given by the following equation:

$$H(\hat{q}, \hat{p}) = \overline{E}(\hat{q}) + \frac{1}{2}|\hat{p}|^2 \quad (7)$$

When $\tau$ represents a virtual period used for a calculation, the Hamilton equation to be integrated is given by the following equation:

$$\frac{dq}{d\tau} = +\frac{\partial H}{\partial \hat{p}} = \hat{p} \quad (8)$$

$$\frac{d\hat{p}}{d\tau} = -\frac{\partial H}{\partial q} = -\hat{\nabla}\overline{E}(\hat{q}) \quad (9)$$

In the equation (9), $\hat{\nabla}$ represents a nabula with the same dimensions as the state variable. (The nabula is a vector that has a component of a differential operator.) The Hamiltonian of the equation (7) is kept constant along the integral path.

When the approximated energy function is a piecewise linear function, a component of the state variable q that is integrated in one divided region is a quadratic curve of time $\tau$. The quadratic curve is extended to the boundary of the region. At this point, the coordinates, the momentum vector and the remaining period of the integral are recorded. With initial conditions of the coordinates and the momentum vector, the Hamilton equation is integrated in the adjacent region. The result of the integral is represented with a quadratic curve. This operation is repeated for a predetermined period $\tau_C$. The state of the value of the state variable q at the resultant point is an alternative of the next state. In each region, since the approximated energy $\overline{E}$ is a linear function of the state variable q, the equations (8) and (9) can be easily integrated. Thus, the next alternative can be easily selected.

Next, with reference to the accompanying drawings, the construction and algorithm of an embodiment of the present invention will be described.

Figure 2:
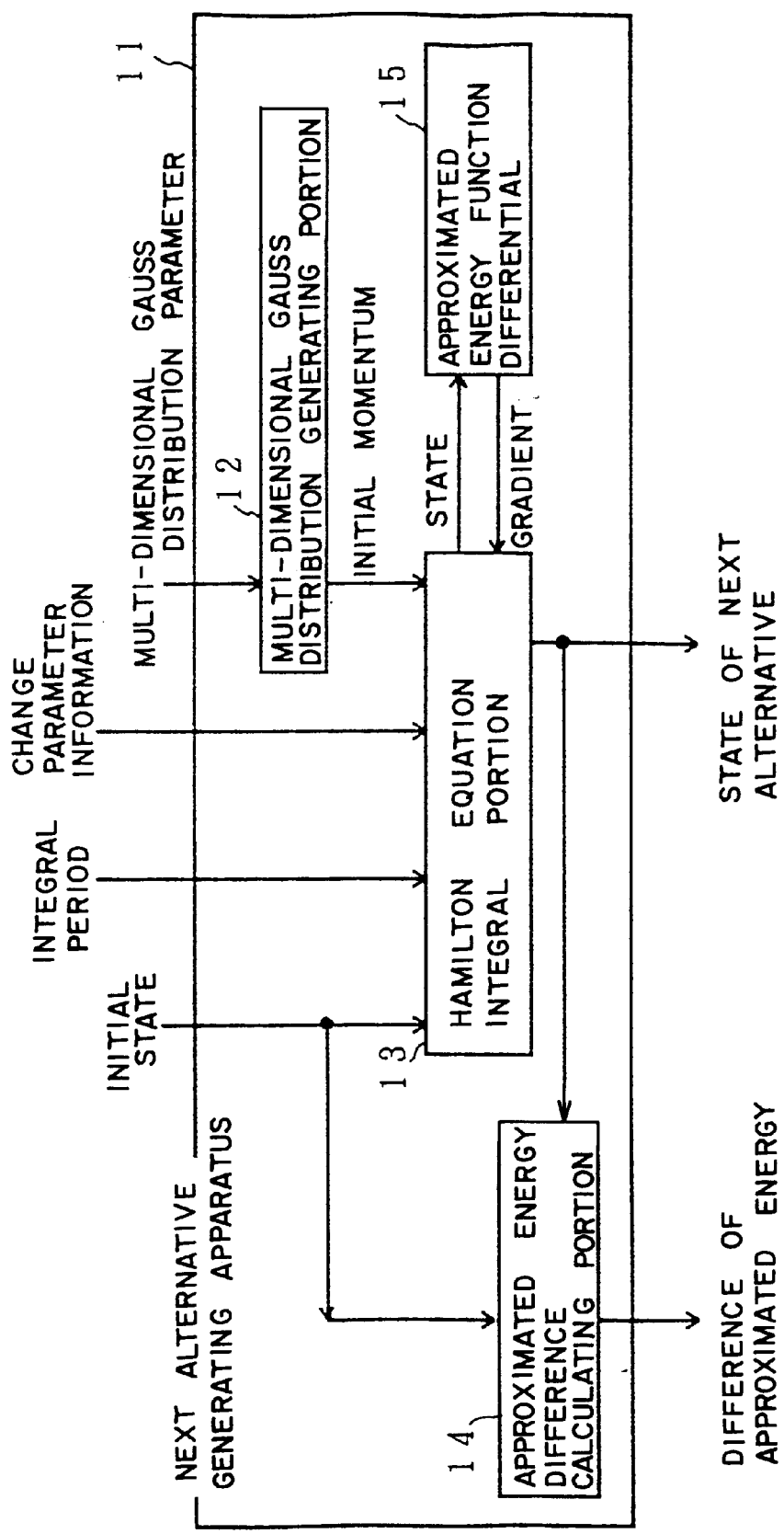
FIG. 2 is a block diagram showing a first construction of a next alternative generating apparatus according to an embodiment of the present invention.
Figure 3:
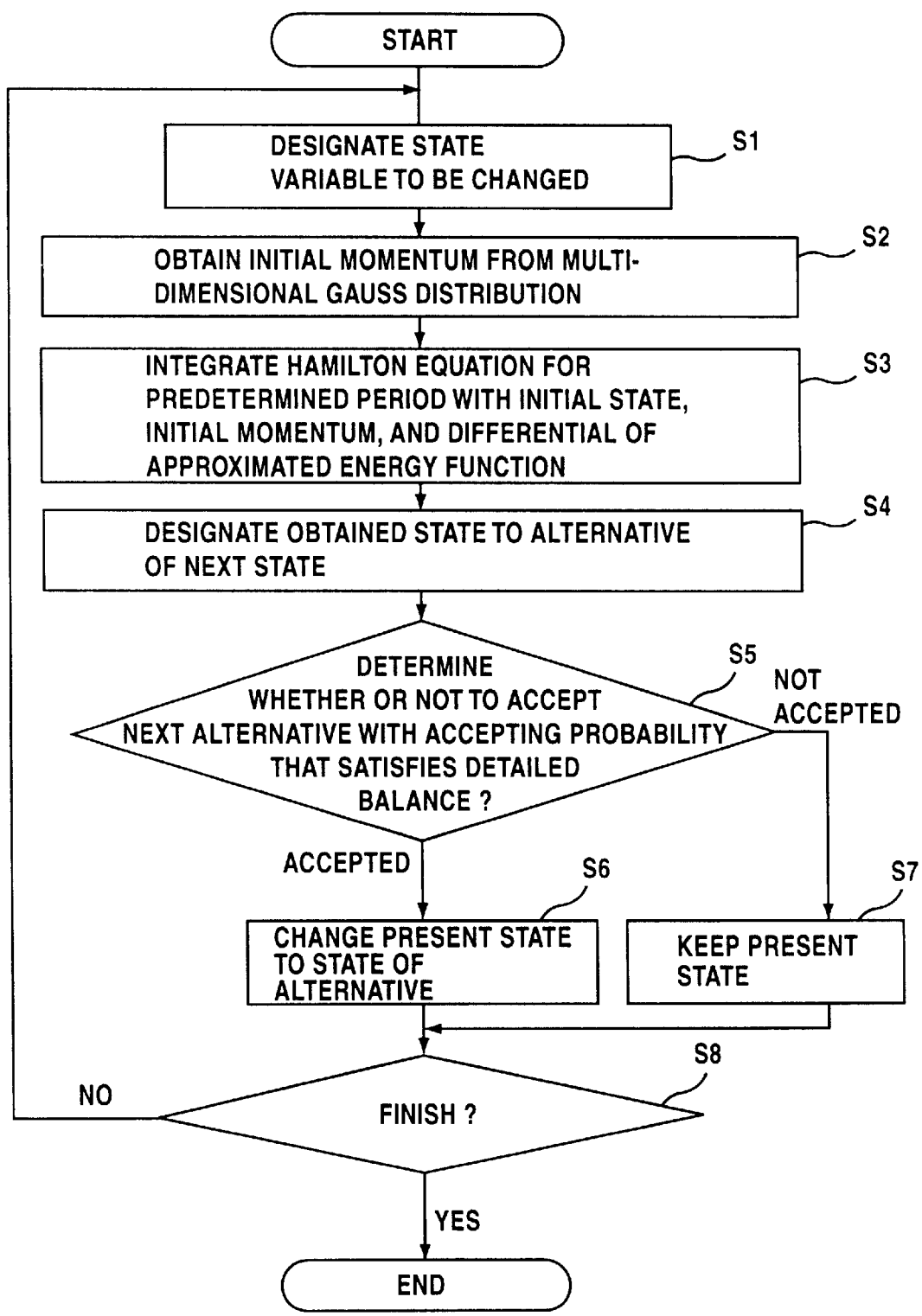
FIG. 3 is a flow chart showing a state transiting process.

FIG. 2 is a block diagram showing a first construction of a next alternative generating apparatus according to the present invention. FIG. 3 is a flow chart showing a state transiting process of the next alternative generating apparatus and an SA simulating apparatus (not shown) or a process thereof. In FIG. 2, a next alternative generating apparatus 11 is an apparatus that generates next alternatives of continuous state variables. The next alternative generating apparatus 11 comprises a multi-dimensional Gaussian distribution generating portion 12, a Hamilton equation integral portion 13, an approximated energy difference calculating portion 14, and an approximated energy function differential generating portion 15.

When the process is started in FIG. 3, a state variable to be changed is designated by the user or the like (at step S1). At this point, the initial state, integral period, change parameter information and multi-dimensional Gaussian distribution parameter are supplied to the next alternative generating apparatus 11. The change parameter information is a designated one of parameters (state variables) that represent a system to be simulated. The initial state represents the present value of a state variable. The multi-dimensional Gaussian distribution parameter represents the dimensions of a parameter to be changed. For example, the multi-dimensional Gaussian distribution parameter is obtained from the change parameter information. The integral period represents a period for which a Hamilton equation is integrated.

The next alternative generating apparatus 11 internally performs the following process. First, the multi-dimensional Gaussian distribution generating portion 12 generates one vector from the multi-dimensional Gaussian probability distribution, designated by the multi-dimensional Gaussian distribution parameter, and outputs the generated vector as an initial momentum (at step S2). The approximated energy function differential generating portion 15 generates a gradient of an approximated energy function of coordinates corresponding to the value of the state variable. (The gradient is a vector that has a component of a first order differential of a function.)

With initial values of the state variable q and the momentum vector p that are the initial state and the initial momentum received from the multi-dimensional Gauss distribution generating portion 12, respectively, the Hamilton equation differential portion 13 integrates the Hamilton equation of the equations (8) and (9) with the gradient $\tilde{\nabla}\bar{E}(\hat{q})$ received from the approximated energy function differential generating portion 15 for the integral period (at step S3). The Hamilton equation differential portion 13 outputs the integral result as the state of the next alternative (at step S4). The approximated energy difference calculating portion 14 calculates the difference between the value of the approximated energy function in the initial state and the value of the approximated energy function in the state of the next alternative obtained by the Hamilton equation integral portion 13 (namely, the difference of the approximated energy).

The next alternative generating apparatus 11 outputs the state of the finally selected next alternative and the difference of the approximated energy to the SA simulating apparatus or the process thereof. The state of the next alternative may be meaningless in such a case where the value of the state variable is out of a defined region. In this case, the SA simulating apparatus, or the process thereof, discards the state of the next alternative. Even if the next alternative is discarded, the detailed balance is still satisfied.

In particular, when the approximated energy function is a piecewise linear function, since $\tilde{\nabla}\bar{E}(\hat{q})$ is a constant vector, a component of the momentum vector p in each region is expressed by a linear curve due to the equation (9). In addition, the component of the state variable q in each region is expressed by a quadratic curve due to the equation (8). Thus, the Hamilton equation can be relatively easily solved.

The approximated energy function $\bar{E}$ may be the original energy function E. However, in most cases, since the number of calculations increases, it seems that the original energy function E is less used. In addition, the approximated energy function $\bar{E}$ should be at least first-order differentiable. The differential result is not always continuous as long as the Hamilton equation can be solved.

With the difference of approximated energy and the state of the next alternative, the SA simulating apparatus, or the process thereof, determines whether or not to accept the state of the next alternative so that the equation (5) is satisfied (at step S5). When the state of the next alternative is accepted, the present state is changed to the state of the next alternative (at step S6). When the state of the next alternative is not accepted, the present state is kept (at step S7). With the accepting probability that satisfies the equation (5), when the difference of the approximated energy $\bar{E}$ is close to the difference of the original energy E, the state of the next alternative can be accepted with a high probability. Thus, since the state of the next alternative generated is less discarded, the speed of the process is increased.

To accomplish such an accepting probability, for example, the metropolis procedure is used in the following manner. For the transition from the state x to the state y, the energy difference $\{E(y)-E(x)\}$ between the original energy in the initial state x and the original energy in the state y of the next alternative is calculated. Thus, the received difference of approximated energy is $\{\bar{E}(y)-\bar{E}(x)\}$. Random numbers ranging from 0 to 1 are uniformly generated. The random numbers are denoted by r. When $A\equiv\exp[-(\{E(y)-E(x)\}-\{\bar{E}(y)-\bar{E}(x)\})/T]\geq r$, the state of the next alternative is accepted. When A<r is satisfied, the present state is kept.

When $[\{E(y)-E(x)\}-\{\bar{E}(y)-\bar{E}(x)\}]\geq 0$, then $0<A\leq 1$. Thus, the probability for accepting the state y is equal to the probability of which the random number r that has a value of A or less. Consequently, $P_A(x\to y)=A/1=\exp[-(\{E(y)-E(x)\}-\{\bar{E}(y)-\bar{E}(x)\})/T]$. For the transition from the state y to the state x, since the state x and the state y, in the definition of A, are substituted with each other, the relation of $A\geq 1\geq r$ is satisfied. Thus, regardless of the value of the random number r, the state x is always accepted. Consequently, the relation of $P_A(y\to x)=1$ is satisfied. As a result, the accepting probability of the equation (6) is accomplished, which satisfies the equation (5).

This method is only an example for determining whether or not to accept the state of the next alternative. Thus, as long as the equation (5) is satisfied, another accepting method may be used.

Thereafter, the SA simulating apparatus, or the process thereof, determines whether or not to finish the process (at step S8). When the next state transition is performed, the process after the step S1 is repeated. Otherwise, the process is finished.

The first construction with respect to the continuous state can be applied to an image restoring process or the like. The image restoring process is a process for restoring an original image from image data affected by noise. As an example of which the SA is applied to the image restoring problem, a technical paper by S. Geman and D. Geman is known (Stochastic relaxation, Gibbs distribution, and the Bayesian restoration of images, IEEE Transactions on Pattern Analysis and Machine Intelligence PAMI-6, No. 6, 1984, pp. 721–742).

In the image restoring process, the value of each pixel represented in a gray level (a real value in a predetermined range) and a line process that is a discrete quantity (0 or 1) between adjacent pixels, are equivalent to a state variable. When the value of the line process is 1, it represents that two adjacent pixels are not continuous or there is a contour line therebetween.

The energy function is composed of three portions. The first portion represents the difference between each pixel value and a pixel with a noise.

The second portion represents the difference between each pixel value and adjacent pixel value thereof. When the value of a line process between adjacent pixels is 1, even if the value of a pixel largely differs from the value of the adjacent pixel, energy does not increase. When the value of the line process is 0, as the value of a pixel differs from the value of the adjacent pixel, energy increases.

The third portion is energy obtained corresponding to the characteristic of the line process. Since it is considered that the line process represents part of a contour line, a sequence of values of the line process does not often intersect. Thus, if such a situation takes place, energy becomes very large. In addition, the sequence of values of the line process hardly curves. Thus, in such a situation, energy becomes relatively large.

With such an energy function, the next alternative generating apparatus 11, according to the first construction, determines the next alternative of the value of a pixel with a continuous quantity in state variables. Thus, the original image can be finally restored. For a line process of a discrete state variable, the value of the next alternative is determined by the conventional metropolis procedure or a next alternative generating apparatus, according to a second construction (that will be described later).

FIG. 4 is a block diagram showing a second construction of the next alternative generating apparatus, according to the present invention. The next alternative generating apparatus 21, shown in FIG. 4, is an apparatus that generates a next alternative in a discrete state. The next alternative generating apparatus 21 comprises a finite dimensional Euclidean space designating portion 22, a region probability distribution generating portion 23, a region probability density ratio calculating portion 24 and a definition range restoring portion 25 as well as the multi-dimensional Gaussian distribution generating portion 12, the Hamilton equation integral portion 13, the approximated energy difference calculating portion 14 and the approximated energy function differential generating portion 15.

The region probability distribution generating portion 23 inputs an initial state, generates one point of the region of a finite dimensional Euclidean space corresponding to the probability distribution thereof, and outputs the coordinates thereof to the Hamilton equation integral portion 13, the approximated energy difference calculating portion 14 and the region probability density ratio calculating portion 24. The finite dimensional Euclidean space designating portion 22 determines the dimension of the finite dimensional Euclidean space of a parameter to be changed corresponding to the change parameter information and outputs the result to the Hamilton equation integral portion 13.

The Hamilton equation integral portion 13 integrates the Hamilton equations of the equations (8) and (9) for the predetermined integral period with the coordinates of the point generated by the region probability distribution generating portion 23, as are initial values of the state variable q in the same manner as the first construction. The Hamilton equation integral portion 13 outputs the coordinates of the resultant point to the approximated energy difference calculating portion 14, the region probability density ratio calculating portion 24 and the defined region restoring portion 25. The approximated energy difference calculating portion 14 calculates the difference of approximated energy between the point in the initial state and the point obtained by the Hamilton equation integral portion 13.

When the region probability density ratio calculating portion 24 receives two points of the finite dimensional Euclidean space, it calculates the ratio of the probability densities of the points in the region and outputs it. More specifically, the region probability density ratio calculating portion 24 calculates the ratio of the probability densities of the start point and the end point of the integral path of the Hamilton equation. The region in which the probability densities are calculated may vary corresponding to the points. The ratio of the probability densities is output as a compensating term for the detailed balance so as to determine whether or not to accept the state of the next alternative. The defined region restoring portion 25 obtains a point in the defined region of the state variable, corresponding to one point in the predetermined finite dimensional Euclidean space, and outputs the point as the state of the next alternative.

With the difference of approximated energy and the compensating term of the detailed balance that are output from the next alternative generating apparatus 21, the SA simulating apparatus, or the process thereof (not shown), determines whether or not to accept the state of the generated next alternative.

In the first and second constructions, the approximated energy $\bar{E}$ is defined so that one set of a state variable to be changed and a value that is not changed are consistently designated. In other words, it is not necessary to globally define the approximated energy $\bar{E}$. For example, when a particular state variable is varied, the definition of the approximated energy $\bar{E}$ can be used. When another state variable is varied, the definition of another approximated energy $\bar{E}$ can be used. This is because whenever the next alternative of each state variable is selected, the approximated energy $\bar{E}$ is used as a tool that generates the selective probability.

Next, with reference to FIGS. 5 to 10, an example for applying the next alternative generating apparatus according to the second construction for an VLSI cell placing problem will be described. The VLSI cell placing problem is a problem for determining the positions of cells in a rectangular cell placing region so as to design a VLSI.

Conventionally, energy used for the SA process of a VLSI cell placing problem is composed of the sum of five types of energy that are, for example routing, overlapping, net congestion, pin congestion and timing driven. Whenever the position of one cell of the VLSI is moved, these types of energy individually increase.

When half perimeter technique is used as a calculating method of energy of a routing that depends on the line length, the energy of the routing is piecewise linear. Thus, even if it is used as approximated energy, the number of calculations is not abnormally increased. In the half perimeter method, the half of the peripheral length of a minimum rectangular that includes the positions of all pins contained in a particular net, is designated as the line length of the net.

For overlapping, net congestion, pin congestion, and so forth, an average quantity of a predetermined region for each epoch is recorded. The resultant quantity is converted into a piecewise linear function. The piecewise linear function is used as approximated energy. However, for these congestions, it should be considered that when a cell is removed from the original position, energy in the region decreases.

For approximated energy of congestions, the original energy is calculated for each basic cell. In a region of a right triangle or a rectangle with vertexes of the calculated original energy, a piecewise linear function is used. For each line and each column, the congestions are calculated. If the congestion at a particular point is defined as the sum of the congestion of the line and the congestion of the column, the rectangular region can be used as a unit.

FIG. 5 is a block diagram showing the construction of a VLSI cell placing apparatus, according to an embodiment. The VLSI cell placing apparatus 31 shown in FIG. 5 comprises a cell selecting portion 32, a cell state reading portion 33, a multi-dimensional Gaussian distribution parameter designating portion 34, an integral period designating portion 35, a cell state storing portion 36, a cell state changing portion 37 and an acceptance determining portion 38 as well as the next alternative generating apparatus 21, shown in FIG. 4.

The cell selecting portion 32 selects a cell to be moved next and outputs the selected result as change parameter information to the next alternative generating apparatus 21. When the cell state reading portion 33 receives a cell to be moved from the cell selecting portion 32, the cell state reading portion 33 reads the present state of the cell from the cell state storing portion 36 and outputs the read state as an initial state to the next alternative generating apparatus 21.

The multi-dimensional Gaussian distribution parameter designating portion 34 outputs a multi-dimensional Gaussian distribution to the next alternative generating apparatus 21. The integral period designating portion 35 outputs an integral period to the next alternative generating apparatus 21. The acceptance determining portion 38 receives the state of the next alternative, the difference of approximated energy, and the compensating term of the detailed balance from the next alternative generating apparatus 21 and determines whether or not to accept the state of the next alternative. When the acceptance determining portion 38 accepts the state of the next alternative, the cell state changing portion 37 rewrites the state of the cell in the cell state storing portion 36. After the above-described process sequence is finished, the cell selecting portion 32 determines a cell to be moved next.

When the present invention is applied to a VLSI cell placing problem, it is preferably applied to the energy of routing. Next, an example of this problem will be described.

In a VLSI cell placing problem, a state variable that determines energy is a position in which a cell is placed. The state variable is discretely defined on a chip. However, when the position in which a cell is placed is represented by a particular point in the region corresponding to a basic cell, the detailed balance is not satisfied. This is because the result of an integral of a Hamilton equation starting with the particular point does not always accord with any basic cell.

To solve this problem, the next alternative generating apparatus 21 divides the entire region on the chip into regions corresponding to basic cells. When a particular cell is selected, the region of the basic cell in which the particular cell is placed is obtained. The Hamilton equation is integrated from the obtained point. A basic cell with the region including the resultant point is determined as an alternative of a cell to be moved. The ratio of probability densities of the two points is output as a compensating term of the detailed balance. The acceptance determining portion 38 determines whether or not to accept the state of the next alternative corresponding to the compensated accepting method with the compensating term of the detailed balance. Thus, while the detailed balance is satisfied, a discrete state variable can be used.

As another problem, the energy of routing varies corresponding to the rotating state of a cell. In a conventional cell placing program, as coordinates of a logical pin in a cell (a virtual pin in a logical design), the average value of the coordinates of pins with the same potential corresponding to the logical pin is used. The positions of the pins with the same potential vary corresponding to the rotations of cells. Thus, the coordinates of the logical pin vary. Consequently, the energy of routing depending on the line length between logical pins varies.

As one method for solving this problem, it is assumed that the coordinates of all pins are at the center of a cell. It is also assumed that the approximated energy used in an integral of a Hamilton equation is calculated corresponding to such an assumption. In addition, it is assumed that a cell parallely moves with the same orientation as the initial state without rotation. When the cell is finally placed in the position of the alternative, the rotation is also considered so that the cell can be placed in the basic cell. In this case, since the cell has the same orientation, the origin of the cell is not always placed in the position of the alternative. Before and after the cell is moved, the number of positions of the cell placed in the basic cell may vary. In this case, so as to satisfy the detailed balance, the number of positions is compensated corresponding to, for example, the accepting probability.

Figure 6:
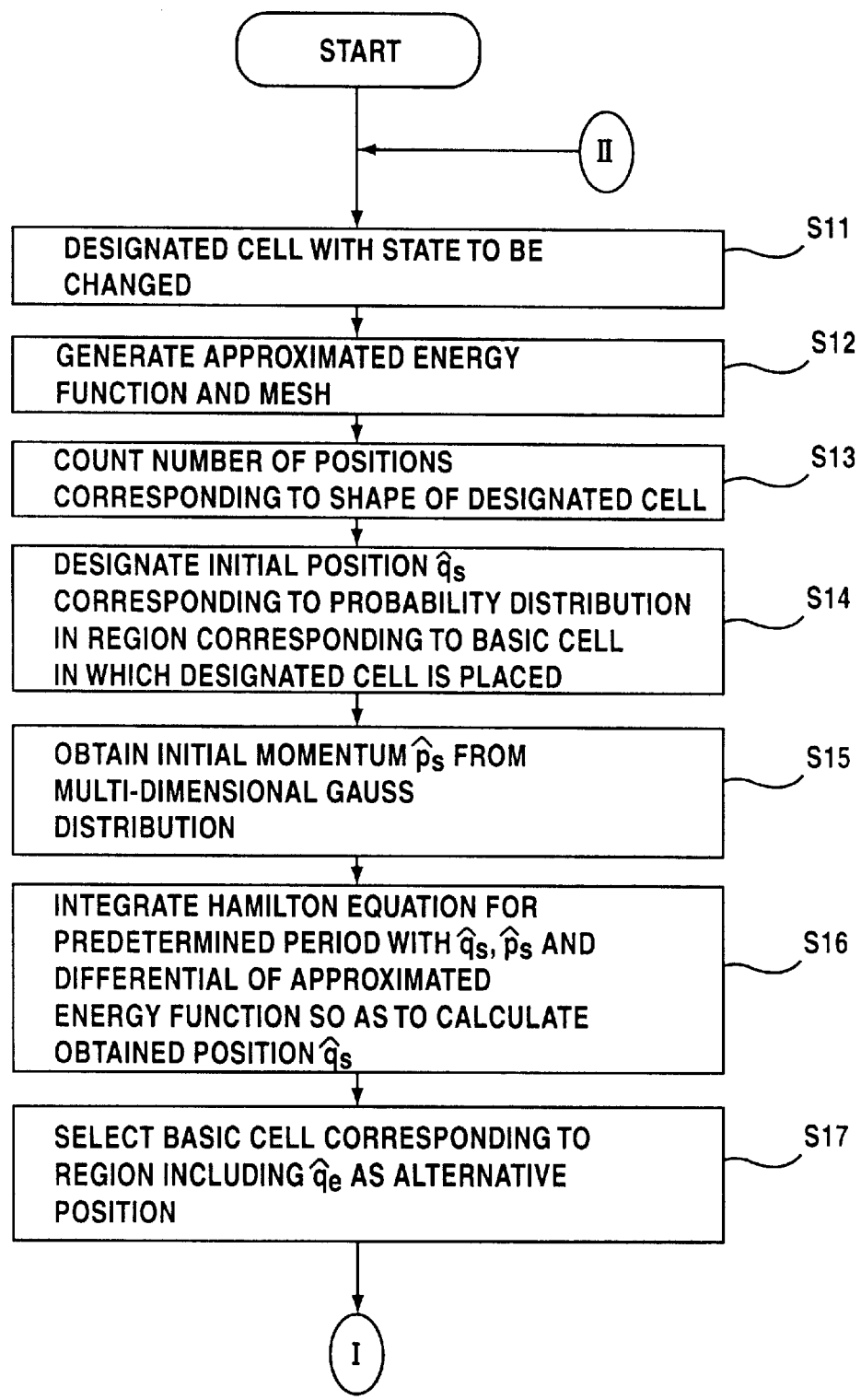
FIG. 6 is a flow chart showing a VLSI cell placing process (No. 1)
Figure 7:
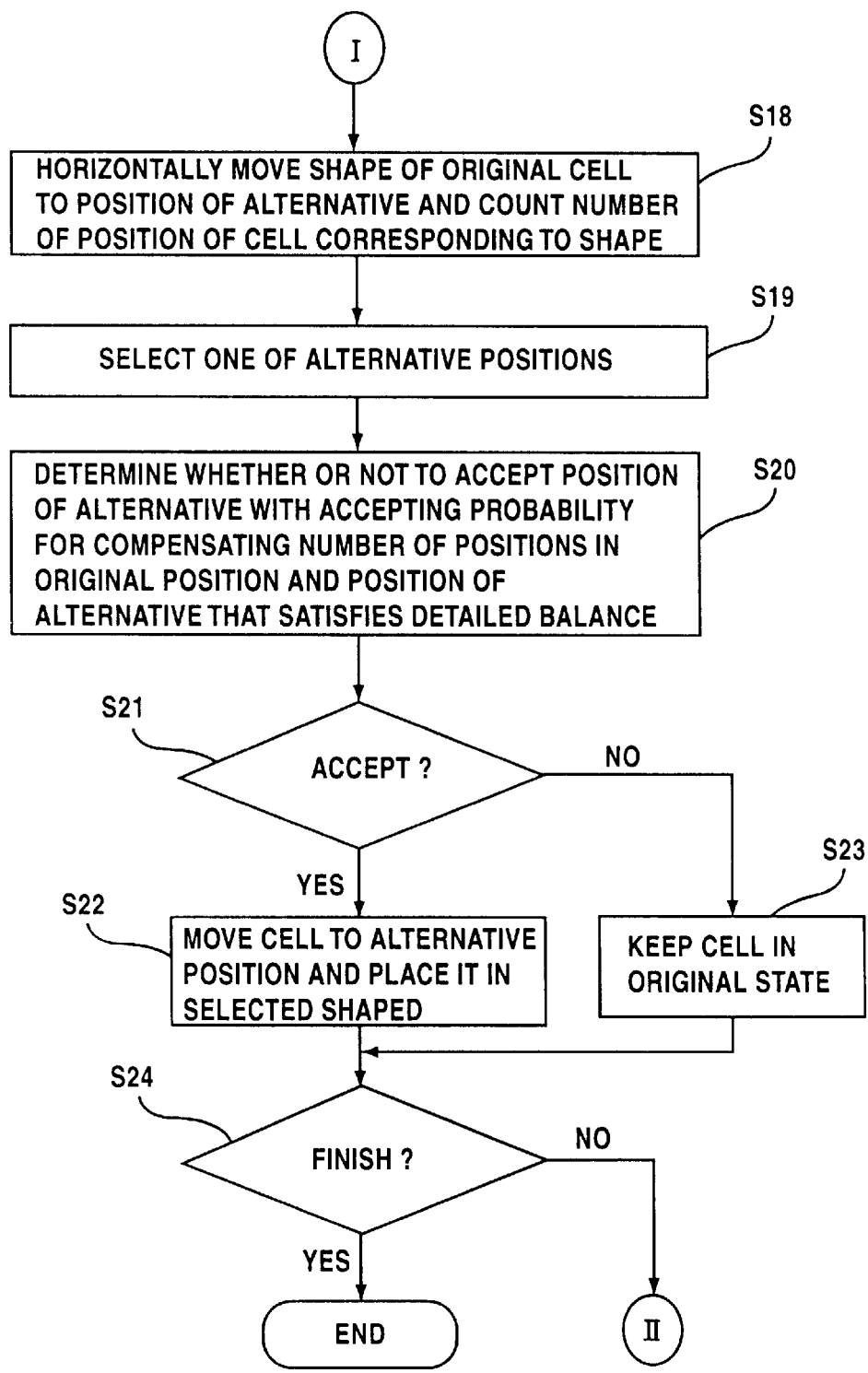
FIG. 7 is a flow chart showing the VLSI cell placing process (No. 2)

FIGS. 6 and 7 are the first and second parts of a flow chart of a VLSI cell placing process in the case where the energy of routing is used as approximated energy.

When the process is started in FIG. 6, the cell selecting portion 32 designates a cell of which the state is changed (at step S11). Thus, the designated cell becomes an object to be moved. Thereafter, according to a predetermined method, an approximated energy function, corresponding to the designated cell, and a region (mesh) in a Euclidean space, corresponding to a discrete cell position, are generated (at step S12).

Since the approximated energy function and the mesh depend on a cell being to be moved, the cell selecting portion 32 may generate the function and the mesh and output them to the next alternative generating apparatus 21. Alternatively, the user may create the approximated energy function and the mesh and input them to the VLSI cell placing apparatus 31. As another alternative method, the next alternative generating apparatus 21 may generate the approximated energy function and the mesh corresponding to the change parameter information.

Next, the calculating method of the approximated energy function for the routing and the method for generating the mesh that is an integral unit of a Hamilton equation, will be described in detail. The approximated energy function and the mesh are determined whenever one cell is placed.

The energy of routing is calculated by the above-described half perimeter method. At this point, it is assumed that the coordinates of each pin are at the center of a cell thereof so as to prevent the influence of the rotation of the cell. Generally, since one cell has a plurality of pins that are connected to a plurality of different nets, a net connected to a designated cell becomes designated. The amount of routing (line length) of the designated net corresponding to the coordinates of the cell depends on the relation among the maximum value and minimum value of the coordinates of other pins and the coordinates of the pin of the cell. For example, as long as the coordinates of the center of the cell are in the range of the maximum value and minimum value of the coordinates of the other pins, the amount of routing is constant. The amount of routing is used as the approximated energy.

In reality, the maximum values and minimum values of x and y coordinates of other pins for each net connected to the designated cell are obtained with the following precautions. (1) A plurality of pins of an objective cell may be included in a net. In this case, it is necessary to obtain the maximum values and minimum values of other pins excluding such pins.
(2) It is assumed that the coordinates of the pin are at the center of the cell thereof.

Figure 8:
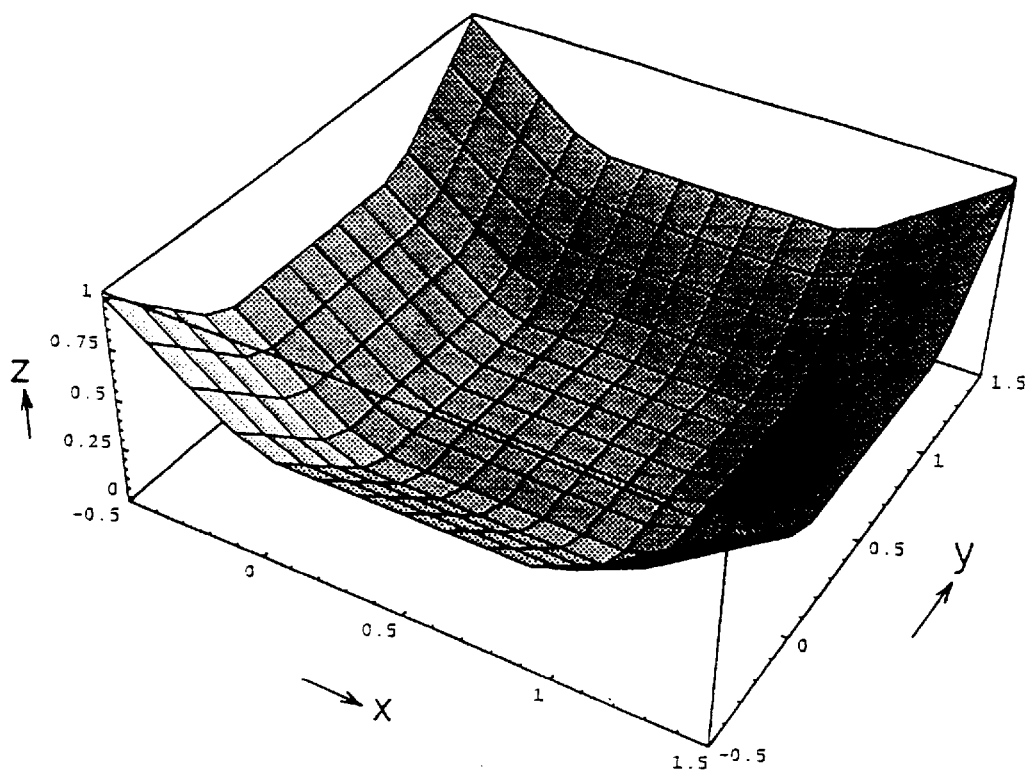
FIG. 8 is a schematic diagram showing an energy function of a VLSI cell placing problem.

The energy of routing of a particular net is expressed by a piecewise linear function with boundaries of obtained maximum values and minimum values as shown in FIG. 8. The xy coordinates of a point on a curved surface, shown in FIG. 8, represent the coordinates at the center of a cell to be moved. The z coordinate represents the energy of routing in the case where the cell is placed at the position. In FIG. 8, a rectangular region with the lowest energy accords with a distribution region of other pins of an objective net (namely, a minimum rectangular region including the other pins).

Such a rectangular region is present for each net connected to an objective cell. The final approximated energy function is expressed by the sum of the energy of routing for each net connected to the cell. Thus, the final approximated energy function is a piecewise linear function.

Meshes, shown in FIG. 8, are composed of the rectangular regions. In other words, for each net connected to one cell, the maximum value and minimum value of x and y coordinates of pins that are not connected to the cell are obtained. With boundaries of the obtained maximum and minimum values, meshes are formed. In each small region of the meshes, the approximated energy function is linear.

Thereafter, for example, the cell selecting portion 32 counts the number of positions of a cell placed in a cell shape, designated at step S11, with considering the rotation of the cell and so forth (at step S13). The region probability distribution generating portion 23 of the next alternative generating apparatus 21 obtains one point of the region as an initial position $\hat{q}_S$ corresponding to the uniform probability distribution in the region of the Euclidean space corresponding to the basic cell at which the origin of the cell is placed (at step S14). The multi-dimensional Gaussian distribution generating portion 12 obtains one vector from the multi-dimensional Gauss distribution as an initial momentum $\hat{p}_S$ (at step S15).

Thereafter, the Hamilton equation integral portion 13 integrates a Hamilton equation of which an approximated energy function has potential energy for an integral period with the initial conditions of the initial position $\hat{q}_S$ and the initial momentum $\hat{p}_S$ (at step S16). The obtained point position and momentum are represented by $\hat{q}_e$ and $\hat{p}_e$, respectively. At this point, the approximated energy function differential generating portion 15 generates $\hat{\nabla} E$ corresponding to the approximated energy function generated at step S12 and outputs it to the Hamilton equation integral portion 13.

Next, the integrating method of a Hamilton equation using meshes will be described in detail.

Figure 9:
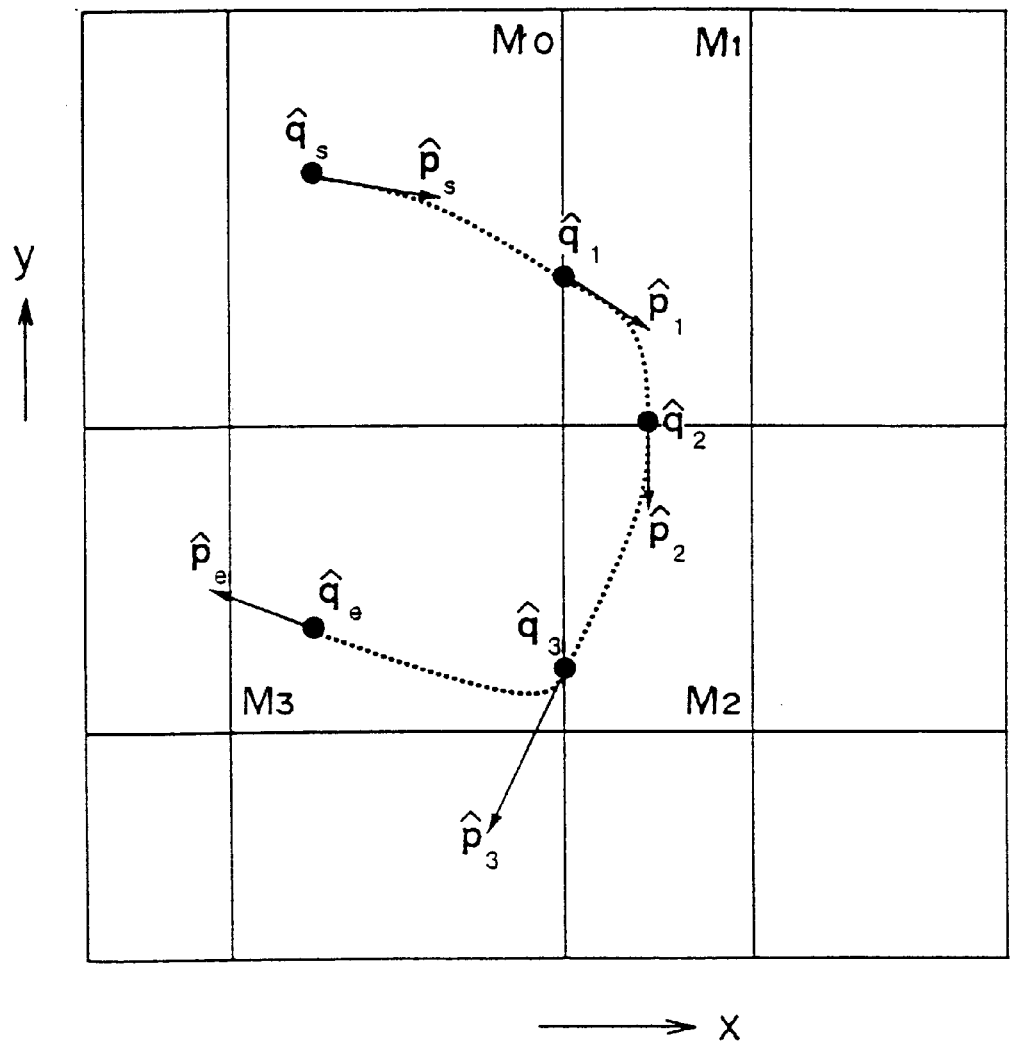
FIG. 9 is a graph showing an example of an integral path.

FIG. 9 is a schematic diagram showing an integral path of a Hamilton equation. In FIG. 9, straight lines in x and y axes represent boundaries of meshes. As boundaries, the maximum and minimum values of the coordinates of pins are used. Thus, the widths of meshes are not uniform.

Now, it is assumed that the initial position $\hat{q}_S$ is in a mesh $M_0$ and an integral period designated by the integral period designating portion 35 is denoted by $\tau_I$. Since $\hat{\nabla} E$ is constant in the mesh $M_o$ (the value is denoted by $(\hat{\nabla} E)_0$), the equations (8) and (9) are solved in the mesh $M_0$ as follows:

$$\hat{q} = \hat{q}_s + \hat{p}_s \tau - \frac{1}{2} (\hat{\nabla} E)_0 \tau^2 \qquad (10)$$

$$\hat{p} = \hat{p}_S - (\hat{\nabla} E)_0 \tau \qquad (11)$$

The solution of the equation (10) represents a quadratic curve with respect to period $\tau$. In particular, $(\hat{\nabla} E)_0 = 0$ represents a linear curve (namely, a straight line). First, the point of intersection of the quadratic curve and the boundary lines of the mesh and the period required for the intersection are calculated. The position of the point of intersection is denoted by $\hat{q}_1$ and the required period is denoted by $\tau_0$.

When $\tau_I \leq \tau_0$, the position $\hat{q}_e$ and the momentum $\hat{p}_e$ are given and the integration of the Hamilton equation is finished.

$$\hat{q}_e = \hat{q}_s + \hat{p}_s \tau_I - \frac{1}{2} (\hat{\nabla} E)_0 \tau_I^2 \qquad (12)$$

$$\hat{p}_e = \hat{p}_S - (\hat{\nabla} E)_0 \tau_I \qquad (13)$$

When $\tau_I > \tau_0$, the position of the point of intersection $\hat{q}_1$ and the momentum $\hat{p}_1$ are given as follows:

$$\hat{q}_1 = \hat{q}_s + \hat{p}_s \tau_0 - \frac{1}{2} (\hat{\nabla} E)_0 \tau_0^2 \qquad (14)$$

$$\hat{p}_1 = \hat{p}_S - (\hat{\nabla} E)_0 \tau_0 \qquad (15)$$

Next, the period $\tau_I$ is substituted with $\tau_I = \tau_1 - \tau_0$. A mesh that contacts the mesh $M_0$ with a boundary of a side of the position of the point of intersection $\hat{q}_1$ is denoted by $M_1$. In the same manner as the integration of the Hamilton equation for the period $\tau_I$ with the initial conditions of the initial position $\hat{q}_S$ and the initial momentum $\hat{p}_S$ in the mesh $M_0$, the Hamilton equation is integrated for the remaining period $\tau_1$ with the initial conditions of the position of the point of intersection $\hat{q}_1$ and the momentum $\hat{p}_1$ in the mesh $M_1$.

Such an operation is repeated from mesh to mesh until the remaining period becomes 0. At the boundary of each mesh, the position of the point of intersection, the momentum of the point of intersection and the remaining period of the integration are supplied to the integral process of the next mesh. In FIG. 9, the point of intersection on the boundary of the meshes $M_1$ and $M_2$ is $\hat{q}_2$, the momentum thereof is $\hat{p}_2$, the point of intersection of the meshes $M_2$ and $M_3$ is $\hat{q}_3$, and the momentum thereof is $\hat{p}_3$. At the position $\hat{q}_e$ in the mesh $M_3$, the remaining period is 0.

According to this method, when the integral path is reversely moved, the initial position is obtained. When a Hamilton equation is integrated for the period $\tau_I$ with the initial conditions of a set of $(\hat{q}_e, -\hat{p}_e)$ that have a different sign of $(\hat{q}_e, \hat{p}_e)$ as the final integral result of the Hamilton equation, the results are $(\hat{q}_S, -\hat{p}_S)$.

Next, the defined region restoring portion 25 selects a basic cell corresponding to a region, including the obtained position $\hat{q}_e$, and outputs it as the position of the next alternative (at step S17). For example, the acceptance determining portion 38 counts the number of positions of the cell placed in the shape of which the original cell is parallely moved to the position of the alternative (at step S18 of FIG. 7) and selects one position with the same probability (at step S19).

The acceptance determining portion 38 determines whether or not to accept the position of the alternative using a method that satisfies the detailed balance and accomplishes the accepting probability for compensating the number of positions at the original position and the position of the alternative (for example, the metropolis procedure) (at steps S20 and S21). At this point, to satisfy the detailed balance, the difference of approximated energy and the compensating term of the detailed balance are used.

When the acceptance determining portion 38 accepts the next alternative, the cell state changing portion 37 moves the position of the cell in the cell state storing portion 36 to the position of the next alternative in a selected rotating state (orientation) (at step S22). When the acceptance determining portion 38 does not accept the next alternative, the cell state changing portion 37 keeps the cell in the original state (at step S23).

Thereafter, the cell selecting portion 32 determines whether or not to finish the process (at step S24). When the next state transition is performed, the process from step S11 is repeated. Otherwise, the process is finished.

As described above, when one cell to be moved is determined, it is prepared for calculating alternatives of the positions to which the cell is moved. Thus, when the same cell is moved a plurality of times, the efficiency may be remarkably improved. However, in this case, it is necessary to predetermine the number of times the cell is moved.

At step S12, the boundary of a mesh of the approximated energy function does not always accord with the boundary of a basic cell on a chip. However, when the boundary of a mesh of the approximated energy function is designated to each basic cell, or a half thereof, a mesh that accords with each basic cell, or a half thereof, can be generated. Even if there is a region of a basic cell in which a cell cannot be placed on a chip, when the boundary of each basic cell is included in the boundary of each mesh, such a region can be easily handled.

Figure 10:
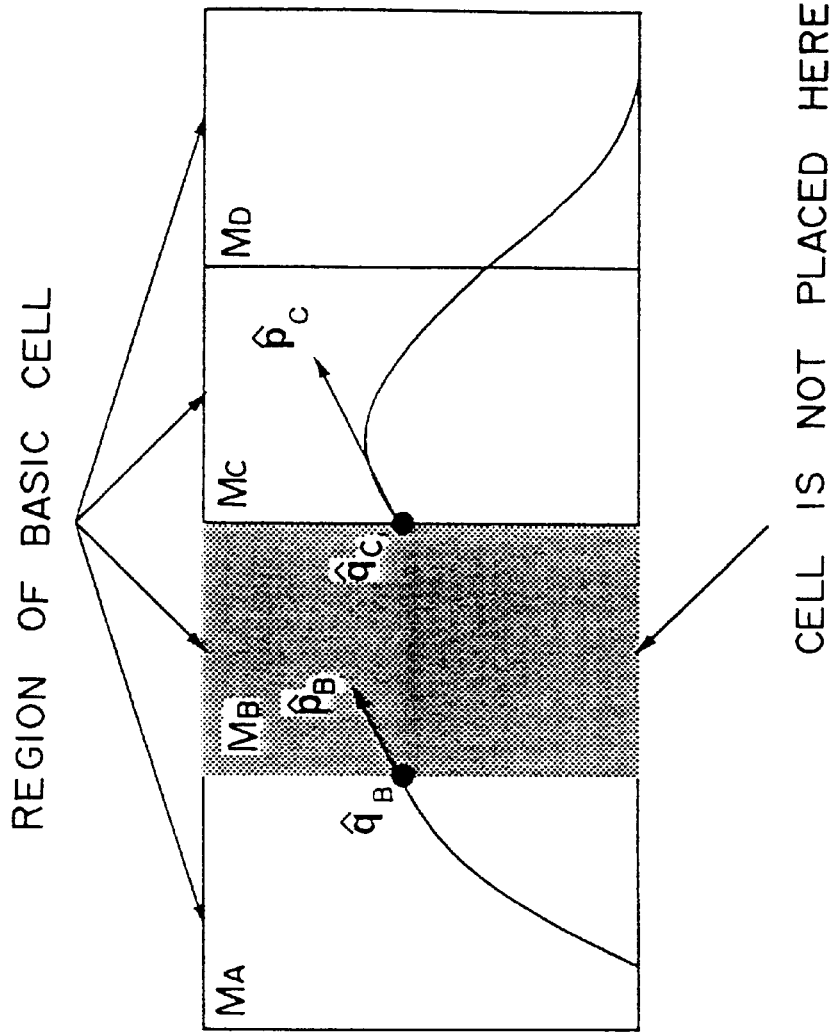
FIG. 10 is a schematic diagram showing an example of a region in which a cell cannot be placed.

FIG. 10 is a schematic diagram showing a region of a basic cell in which a cell cannot be placed. In FIG. 10, it is assumed that the boundary of a mesh accords with the region of a basic cell. In the integration of a Hamilton equation at step S16, the integral path in a mesh $M_A$ is at the point of intersection $\hat{q}_B$ and the momentum thereof is $\hat{p}_B$. However, the cell cannot be placed in the basic cell corresponding to the mesh $M_B$ that contacts the side including the point of intersection $\hat{q}_B$.

Assuming that the mesh $M_B$ is ignored, a basic cell in which a cell can be placed is searched in the direction perpendicular to the side including the point of intersection $\hat{q}_B$. In FIG. 10, the cell can be placed in the basic cell corresponding to the mesh $M_C$. The point of intersection $\hat{q}_B$ is horizontally moved until it contacts the mesh $M_C$. The contacted point is denoted by $\hat{q}_C$. The orientation of the momentum $\hat{p}_C$ at the point of intersection $\hat{q}_C$ is the same as that of the momentum $\hat{p}_B$. The magnitude of the momentum $\hat{p}_C$ is designated so that the following equation is satisfied:

$$\frac{1}{2}|\hat{p}_c|^2 + \overline{E}(\hat{q}_c) = \frac{1}{2}|\hat{p}_B|^2 + \overline{E}(\hat{q}_B) \quad (16)$$

Thereafter, the integral path is extended from the mesh $M_C$ to the mesh $M_D$. In this method, while the detailed balance is satisfied, basic cells in which cells cannot be placed can be ignored.

When the following expression is satisfied $$\overline{E}(\hat{q}_c) > \frac{1}{2}|\hat{p}_B|^2 + \overline{E}(\hat{q}_B) \quad (17)$$

regardless of the momentum $\hat{p}_C$, the equation (16) cannot be satisfied. In this case, the integral path may be reflected. In other words, with the point of intersection $\hat{q}_B$ and the momentum $-\hat{p}_B$ instead of the point of intersection $\hat{q}_C$ and the momentum $\hat{p}_C$, the integral path is extended. Alternatively, at the boundary of the mesh $M_B$ and the mesh $M_C$, the integral path may be reflected.

In the case shown in FIG. 10, basic cells in which cells cannot be placed may not be ignored. In this case, in any mesh, the integral path is extended. If a cell is not placed in a basic cell at the last point, the position cannot be used. For the cell, the next alternative may be generated once again. Alternatively, a new cell may be used.

The cell placing process at a chip edge can be performed by the following two methods. As a first method, even if the integral path exceeds the chip edge, calculations are continued. Since $-(\vec{\nabla}\overline{E})$, on the right side of the equation (9), faces the inside of the chip, even if the path on the way exceeds the chip, the last position is in the chip with a high probability. As a second method, when the integral path exceeds the chip edge, the process is stopped.

In the first method, when the last position is outside the chip, the process of the cell is stopped. In the second method, when the integral path exceeds the chip edge, the process for the cell is stopped.

In the above description, the variance of the multi-dimensional Gauss distribution used for selecting the initial momentum $\hat{p}_S$ was 1. However, a more conventional distribution may be used. For example, to select the momentum $\hat{p}=(p_x, p_y)$ corresponding to the two-dimensional coordinates $\hat{q}=(q_x, q_y)$, the case using a multi-dimensional standard distribution having a density function as expressed by the following equation is considered:

$$\frac{1}{\sqrt{2\pi}\,\sigma_x}e^{-\frac{p_x^2}{2\sigma_x^2}}\frac{1}{\sqrt{2\pi}\,\sigma_y}e^{-\frac{p_y^2}{2\sigma_y^2}} = \frac{1}{(\sqrt{2\pi})^2 \sigma_x \sigma_y}e^{-\frac{1}{2}\left[\frac{p_x^2}{\sigma_x^2} + \frac{p_y^2}{\sigma_y^2}\right]} \quad (18)$$

where $\sigma_x$ and $\sigma_y$ are variances in x and y directions, respectively.

Variable conversions expressed by the following equations are performed:

$$\hat{p}' = \begin{bmatrix} p'_x \\ p'_y \end{bmatrix} = \begin{bmatrix} 1/\sigma_x & 0 \\ 0 & 1/\sigma_y \end{bmatrix}\hat{p} = \begin{bmatrix} 1/\sigma_x & 0 \\ 0 & 1/\sigma_y \end{bmatrix}\begin{bmatrix} p_x \\ p_y \end{bmatrix} \quad (19)$$

$$\hat{q}' = \begin{bmatrix} q'_x \\ q'_y \end{bmatrix} = \begin{bmatrix} 1/\sigma_x & 0 \\ 0 & 1/\sigma_y \end{bmatrix}\hat{q} = \begin{bmatrix} 1/\sigma_x & 0 \\ 0 & 1/\sigma_y \end{bmatrix}\begin{bmatrix} q_x \\ q_x \end{bmatrix} \quad (20)$$

When the probability distribution is represented by the momentum $\hat{p}$, the following standard normal distribution is obtained:

$$\frac{1}{\left(\sqrt{2\pi}\right)^2} e^{-\frac{|\hat{p}'|^2}{2}} \qquad (21)$$

A Hamiltonian corresponding to coordinates $\hat{q}$ and momentum $\hat{p}$ that have been converted with the temperature T is given by the following equation:

$$H(\hat{q}', \hat{p}') = \frac{1}{T}\overline{E}(\hat{q}') + \frac{1}{2}|\hat{p}'|^2 \qquad (22)$$

At this point, the Hamilton equation, with respect to the coordinates $\hat{q}'$ and the momentum $\hat{p}'$, is given by the following equation:

$$\begin{pmatrix} 1/\sigma_x & 0 \\ 0 & 1/\sigma_y \end{pmatrix} \frac{d\hat{q}}{d\tau} = \frac{d\hat{q}}{d\tau} = +\frac{\partial H}{\partial \hat{p}'} = \hat{p}' = \begin{pmatrix} 1/\sigma_x & 0 \\ 0 & 1/\sigma_y \end{pmatrix}\hat{p} \qquad (23)$$

$$\frac{d\hat{q}}{d\tau} = \hat{p} \qquad (24)$$

$$\frac{d\hat{p}'}{d\tau} = \qquad (25)$$

$$-\frac{\partial H}{\partial \hat{q}'} = -\frac{1}{T}\hat{v}_{\hat{q}'}\overline{E}(\hat{q}') = -\frac{1}{T}\hat{v}_{\hat{q}'}\overline{E}(\hat{q}')\frac{\partial \hat{q}}{\partial \hat{q}'} = -\frac{1}{T}\begin{pmatrix} \sigma_x & 0 \\ 0 & \sigma_y \end{pmatrix}\hat{v}_{\hat{q}'}\overline{E}(\hat{q}')$$

Thus, the equation of motion with respect to the coordinates $\hat{q}$ is given by the following equation:

$$\frac{d^2\hat{q}}{d\tau^2} = -\frac{1}{T}\begin{pmatrix} \sigma_x & 0 \\ 0 & \sigma_y \end{pmatrix}^2 \hat{v}_{\hat{q}'}E(\hat{q}) \qquad (26)$$

In the equation (26), as the temperature T increases, the influence of potential energy $\nabla E$ decreases. As the variances $\sigma_x$ and $\sigma_y$ increase, the influence of the gradients thereof increase. As the variances $\sigma_x$ and $\sigma_y$ increase, the evaluation of the momentum p, as the kinetic energy, decreases. Thus, the result of the equation (26) accords with the conventional intuitive inference.

When a basic cell in which a cell cannot be placed is ignored, the temperature and variance affect the VLSI cell placing process. In this case, since kinetic energy and potential energy vary, instead of the equation (18), using the following equation, the mesh $M_B$ should be removed:

$$\frac{1}{2}|\hat{p}'_C|^2 + \frac{1}{T}\overline{E}(q_C) = \frac{1}{2}|\hat{p}'_B|^2 + \frac{1}{T}\overline{E}(\hat{q}_B) \qquad (27)$$

However, in the equation (27), the momentum $\hat{p}_B'$ and the momentum $\hat{p}_C'$ have been converted in the same manner as the momentum $\hat{p}_B$ and the momentum $\hat{p}_C$ corresponding to the equation (19).

Next, a real example of the VLSI cell placing process will be described. The coordinates of a cell are represented by, for example, a set of two discrete integers. The state of one cell can be placed in a two-dimensional Euclidean space corresponding to the x and y coordinates of the position of the origin of a cell. The entire state of a VLSI chip can be placed in a finite dimensional Euclidean space that is the sum of two-dimensional Euclidean spaces of all cells.

The region of the finite dimensional Euclidean space corresponding to each state of a VLSI chip is designated in the following manner. For simplicity, a two-dimensional Euclidean space for each cell is considered. It is assumed that discrete coordinate values of each cell are represented by natural numbers N={1, 2, ... } and that the coordinate values are placed at part of reals R. The region of the basic cell corresponding to the coordinates (2, 5) of a cell is defined as (1.5, 2.5)×(4.5, 5.5). In addition, it is assumed that a probability distribution is predesignated to each region.

The cell selecting portion 32 selects a cell to be moved and outputs the coordinates thereof as change parameter information, that is parameters to be changed to the next alternative generating apparatus 21. The cell state reading portion 33 reads the coordinates of all cells, including the selected cell from the cell state storing portion 36, and outputs them as an initial state to the next alternative generating apparatus 21. The multi-dimensional Gauss distribution parameter designating portion 34 outputs multi-dimensional Gauss distribution parameters to the next alternative generating apparatus 21. The integral period designating portion 35 outputs an integral period to the next alternative generating apparatus 21. In this case, the multi-dimensional Gauss distribution parameters are a set of two positive reals. When the coordinates of the selected cell are (2, 5), the region probability distribution generating portion 23 obtains one point from the region corresponding to the probability distribution of the region (1.5, 2.5)×(4.5, 5.5) corresponding to the coordinates (2, 5) of the cell. This point is represented by, for example (1.89, 5.32).

With the initial position of the point, an initial momentum that is a vector is generated by the multi-dimensional Gauss distribution generating portion 12 corresponding to the multi-dimensional Gauss distribution parameters. With the initial momentum, the Hamilton equation is integrated. The resultant point is denoted by, for example, (3.45, 6.98). The defined region restoring portion 25 obtains coordinates of an integer (3, 7) as the position of the next alternative from the region (2.5, 3.5)×(6.5, 7.5) of the basic cell corresponding to the obtained point (3.45, 6.98).

On the other hand, the region probability density ratio calculating portion 24 calculates the ratio of probability densities at two points (1.89, 5.32) and (3.45, 6.98) and outputs the result as a compensating term of the detailed balance. When a uniform probability distribution is given to each region, the probability density function for Lebesgue s measure is 1. In this case, the ratio of the probability density that is output from the region probability density ratio calculating portion 24 is always 1.

The acceptance determining portion 38 determines whether or not to accept the position of the next alternative corresponding to the compensating term of the detailed balance. Now, assume that the determination of the acceptance of the next alternative is performed corresponding to the metropolis procedure. In addition, assume that the initial position is denoted by $\hat{q}_S$, the position of the next alternative is denoted by $\hat{q}_e$, the rotating state of a cell at the initial position $\hat{q}_S$ is denoted by $R_S$, the rotating state of a cell at the position of the next alternative $\hat{q}_e$ is denoted by $R_e$, the number of rotating states at the initial position $\hat{q}_S$ is denoted by $r_S$, and the number of rotating states at the position of next alternative $\hat{q}_e$ is denoted by $r_e$. Thus, the probabilities of which the rotating states $R_S$ and $R_e$ are selected is represented by $1/r_S$ and $1/r_e$, respectively. Moreover, assumed that a point corresponding to the initial position $\hat{q}_S$ is denoted by $\hat{q}_S'$, a point corresponding to the position of the next alternative $\hat{q}_e$ is denoted by $\hat{q}_e'$, the original energy function is denoted by E, the approximated energy function is denoted by $\overline{E}$, the probability density at the initial position $\hat{q}_s'$ is denoted by $p(\hat{q}_s')$, the probability density at the position of the secondary alternative $\hat{q}_e'$ is denoted by $p(\hat{q}_e')$, and the temperature parameter is denoted by T. In this case, the acceptance determining portion 38 calculates the value A of the next equation.

$$A' = \exp\left[-\frac{\{E(\hat{q}_e) - E(\hat{q}_s)\} - \{\overline{E}(\hat{q}_e') - \overline{E}(\hat{q}_s')\}}{T}\right] \times \frac{p(\hat{q}_e')}{p(\hat{q}_s')} \cdot \frac{r_s}{r_e} \quad (28)$$

Random numbers ranging from 0 to 1 are uniformly generated. The random numbers are represented by r. When $A \geq r$, the acceptance determining portion 38 accepts the position of the next alternative. When A<r, the acceptance determining portion 38 does not accept the position of the next alternative.

In the equation (28), the energy function E is a function of coordinates of a discrete cell. In contrast, the approximated energy function $\overline{E}$ is a function of continuous coordinates of a finite dimensional Euclidean space. The next alternative generating apparatus 21 supplies the difference of approximated energy $\{\overline{E}(\hat{q}_e') - \overline{E}(\hat{q}_s')\}$ and the compensating term of the detailed balance $\{p(\hat{q}_e')/p(\hat{q}_s')\}$. In particular, when a uniform probability distribution is given, since $p(\hat{q}_e')/p(\hat{q}_s')=1$, the compensating term of the detailed balance does not affect the value of A.

When the acceptance determining portion 38 accepts the position of the next alternative, the cell state changing portion 37 updates the state of the cell in the cell state storing portion 36. When the acceptance determining portion 38 does not accept the position of the next alternative, the cell state changing portion 37 keeps the original state.

In the case of a VLSI cell placing problem, the coordinates of a cell to be moved accord with the number of state variables to be changed. The sets of coordinates of other cells are sets of state variables that are not changed. When an objective cell is moved, the definition of one approximated energy function $\overline{E}$ should be employed. When another cell is moved, the definition of another E can be used. Thus, it is not necessary to globally define the approximated energy function $\overline{E}$ with respect to all state variables.

In the above embodiment, the next alternative generating apparatus 21 is applied to the VLSI cell placing problem. However, the present invention is not limited to such a field. Instead, the present invention can be applied for any problem that can define a continuous or discrete state variable and an energy function.

For example, the present invention can be applied for a graph partitioning problem of which a graph composed of nods and branches is partitioned (Johnson et al., OPTIMIZATION BY SIMULATED ANNEALING: AN EXPERIMENTAL EVALUATION; PART I, GRAPH PARTITIONING, Operations Research, Vol. 37, No. 6, 1989, pp. 865–892) and a graph coloring problem of which a graph is colored (Johnson et al., OPTIMIZATION BY SIMULATED ANNEALING: AN EXPERIMENTAL EVALUATION; PART II, GRAPH COLORING AND NUMBER PARTITIONING, Operations Research, Vol. 39, No. 3, 1991, pp. 378–406). The graph partitioning problem can be applied to circuit designs and so forth. The graph coloring problem can be applied to scheduling. In addition, the present invention can be applied to production planning problems (Yugami, Hara, et al., SOLUTION OF LARGE SCALE PRODUCTION PLANNING PROBLEM CORRESPONDING TO SIMULATED ANNEALING, ARTIFICIAL INTELLIGENCE VOL. 90-8, pp. 61–69). In a production planning problem, the types of products produced by a machine are represented by state variables. The insufficient quantity of products is represented by energy.

Figure 11:
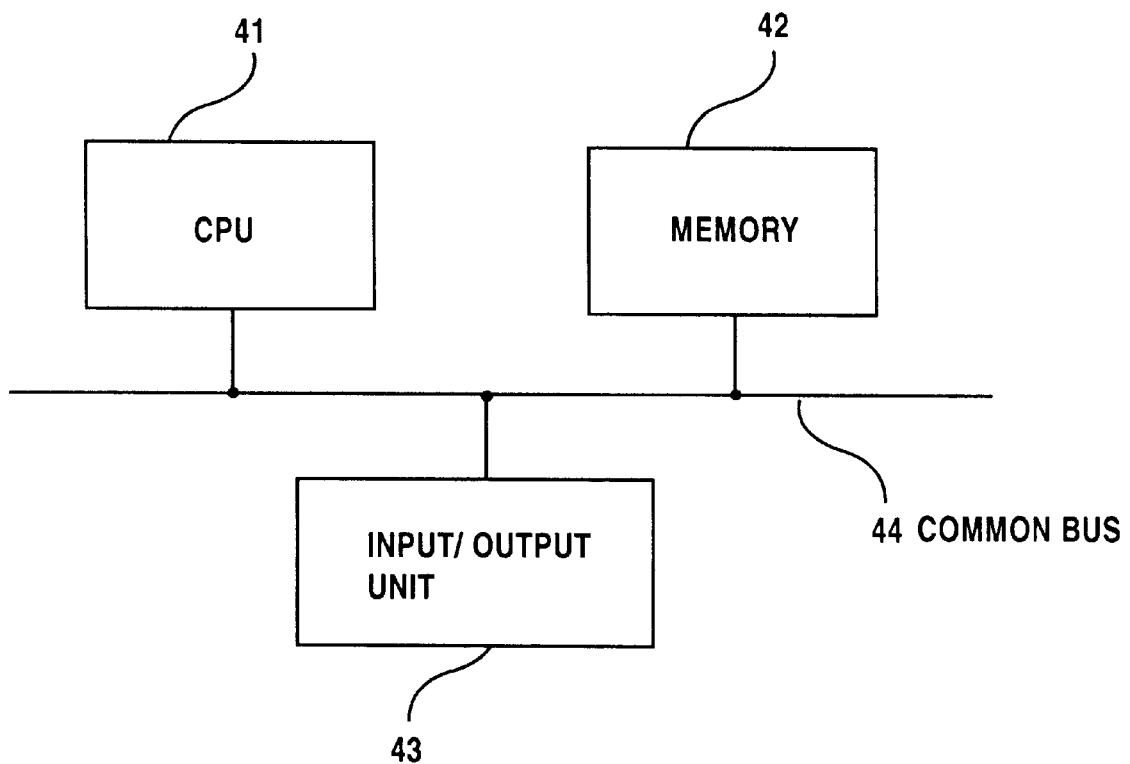
FIG. 11 is a block diagram showing a systematic construction of the present invention.

FIG. 11 is a block diagram showing a system construction of the next alternative generating apparatus 21 and the VLSI cell placing apparatus 31 according to the present invention. The system shown in FIG. 11 comprises a central processing unit (CPU) 41, a memory 42, an input/output unit 43 and a common bus 44 that connects them.

The CPU 41 executes a program stored in the memory 42 so as to accomplish the functions of the multi-dimensional Gauss distribution generating portion 12, the Hamilton equation integral portion 13, the approximated energy difference calculating portion 14, the approximated energy function differential generating portion 15, the finite dimensional Euclidean space designating portion 22, the region probability distribution generating portion 23, the region probability density ratio calculating portion 24, the defined region restoring portion 25, the cell selecting portion 32, the cell state reading portion 33, the multi-dimensional Gauss distribution parameter designating portion 34, the integral period designating portion 35, the cell state changing portion 37, the acceptance determining portion 38, and so forth.

The memory 42 also functions as the cell state storing portion 36. The input/output unit 43 causes data to be stored in the memory 42 and the processed result to be output.

Although the present invention has been shown and described with respect to best mode embodiments thereof, it should be understood by those skilled in the art that the foregoing and various other changes, omissions and additions in the form and detail thereof may be made therein without departing from the spirit and scope of the present invention.

What is claimed is:

1. An image restoring apparatus for changing a value of each of continuous pixels to the next value thereof so as to obtain a proper image, comprising:

input means for inputting a value of a pixel at present from given image data and a predetermined period;

storage means for storing the value of the pixel at present and the predetermined period;

momentum generating means for generating a value of a momentum;

energy generating means for generating a gradient of a piecewise linear energy function, which has a simpler form than an original energy function and simplifies a calculation, corresponding to a given value of a pixel;

integral means for performing digital processing of a simplified integration of a Hamilton equation for the predetermined period with initial conditions of the value of the pixel at present stored in said storage means and the momentum generated by said momentum generating means, said integral means calculating a resultant value of the pixel using the value of the period, the pixel at present, the momentum, and a gradient obtained from said energy generating means by giving a value of the pixel to said energy generating means; and output means for outputting the resultant value of the pixel as a value of the next alternative, and for restoring the proper image using the value of the next alternative.

2. A cell placing apparatus for moving a cell on a semiconductor chip from a present position to the next position so as to obtain a proper cell position, comprising:

input means for mapping a discrete position of a cell on the semiconductor chip into a continuous space generated in a computer, obtaining a present point in the continuous space corresponding to the present cell position, and inputting data of the present point and a predetermined period;

storage means for storing data of the point at present and the predetermined period;

momentum generating means for generating data of a momentum;

energy generating means for generating a gradient of a piecewise linear energy function which has a simpler form than an original energy function and simplifies a calculation corresponding to a given data of a point;

integral means for performing digital processing of a simplified integration of a Hamilton equation for the predetermined period with initial conditions of the present point stored in said storage means and the momentum generated by said momentum generating means, said integral means calculating a resultant point using the data of the period, the present point, the momentum, and a gradient obtained from said energy generating means by giving data of a point to said energy generating means;

output means for outputting data of a discrete position of the cell corresponding to the resultant point as a position of the next alternative, and for determining the proper cell position on the semiconductor chip using the position of the next alternative; and means for moving the cell from the present position to the next position based on said data.

3. An image restoring method for changing a value of each of continuous pixels to the next value so as to obtain a proper image, comprising the steps of:

inputting a value of a pixel at present from given image data and a predetermined period to a computer;

automatically generating data of a momentum;

automatically generating data of a gradient of a piecewise linear energy function, which has a simpler form than an original energy function and simplifies a calculation, corresponding to the input value of the pixel;

calculating a resultant value of the pixel using the value of the predetermined period, the pixel at present, the momentum, and the gradient by performing digital processing of a simplified integration of a Hamilton equation for the period with initial conditions of the value of the pixel at present and the momentum;

repeating an automatic generation of the gradient corresponding to the resultant value of the pixel and an integration of the Hamilton equation;

restoring the proper image using a resultant value of the pixel obtained after repetition.

4. A placing method for moving an object on a semiconductor chip in a placing region from a position to the next position so as to obtain a proper object position, comprising the steps of:

inputting a discrete present position of the object in the placing region and a predetermined period to a computer;

mapping the present position into a continuous space generated in the computer;

obtaining a present point in the continuous space corresponding to the present position;

automatically generating data of a momentum;

automatically generating data of a gradient of a piecewise linear energy function, which has a simpler form than an original energy function and simplifies a calculation, corresponding to the present point;

calculating a resultant point in the continuous space using the value of the predetermined period, the present point, the momentum, and the gradient by performing digital processing of a simplified integration of a Hamilton equation for the period with initial conditions of the present point and the momentum;

repeating an automatic generation of the gradient corresponding to the resultant point and an integration of the Hamilton equation;

placing the object in the proper object position on the semiconductor chip corresponding to a resultant point obtained after repetition.

5. The placing method as set forth in claim 4, further comprising the step of:

determining with the computer whether or not to accept the resultant point so that detailed balance is satisfied.

6. The placing method as set forth in claim 4, further comprising the steps of:

obtaining a difference between a value of the piecewise linear energy function in the present point and a value of the piecewise linear energy function in the state of the resultant point using the computer; and determining whether or not to accept the state of the resultant point with the difference of the piecewise linear energy function using the computer.

7. An image restoring method for changing a value of each of continuous pixels to the next value so as to obtain a proper image, comprising the steps of:

inputting a value of a pixel at present from given image data to a computer;

selecting the next value of the pixel so that an accepting probability for accepting the next value of the pixel increases using the computer;

calculating a difference between energy corresponding to the value of the pixel at present and corresponding to the next value according to an original energy function;

calculating a difference between energy corresponding to the value of the pixel at present and corresponding to the next value according to a simplified energy function which has a simpler form than the original energy function and simplifies a calculation;

accepting the next value according to the accepting probability based on the difference of the simplified energy function and the difference of the original energy function;

restoring the proper image using the next value of the pixel when the next value is accepted.

8. A placing method for moving an object on a semiconductor chip in a placing region from a position to the next position so as to obtain a proper object position, comprising the steps of:

inputting a discrete present position of the object in the placing region to a computer;

mapping the present position into a continuous space generated in the computer;

obtaining a present point in the continuous corresponding to the present position;

selecting the next point in the continuous space so that an accepting probability for accepting the next point increases using the computer;

calculating a difference between energy corresponding to the present point and corresponding to the next point according to an original energy function;

calculating a difference between energy corresponding to the present point and corresponding to the next point according to a simplified energy function which has a simpler form than the original energy function and simplifies a calculation;

accepting the next point according to the accepting probability based on the difference of the simplified energy function and the difference of the original energy function;

placing the object in the proper object position using the next position in the placing region on the semiconductor chip corresponding to the next point when the next point is accepted.

* * * * *